United States Patent [19]
Okamoto

[11] Patent Number: 5,404,326
[45] Date of Patent: Apr. 4, 1995

[54] STATIC RANDOM ACCESS MEMORY CELL STRUCTURE HAVING A THIN FILM TRANSISTOR LOAD

[75] Inventor: Yutaka Okamoto, Tokyo, Japan

[73] Assignee: Sony Corporation, Tokyo, Japan

[21] Appl. No.: 82,380

[22] Filed: Jun. 28, 1993

[30] Foreign Application Priority Data

Jun. 30, 1992 [JP] Japan .................. 4-173390
Jun. 30, 1992 [JP] Japan .................. 4-173395

[51] Int. Cl.[6] ............................. G11C 11/40
[52] U.S. Cl. .................. 365/156; 365/154; 257/903
[58] Field of Search ............... 365/154, 156; 257/903

[56] References Cited

U.S. PATENT DOCUMENTS

| | | | |
|---|---|---|---|
| 4,841,481 | 6/1989 | Ikeda | 365/154 |
| 4,894,801 | 1/1990 | Saito | 365/154 |
| 5,018,102 | 5/1991 | Houston | 365/154 X |
| 5,034,797 | 7/1991 | Yamanaka | 365/156 X |
| 5,132,771 | 7/1992 | Yamanaka | 257/903 |
| 5,134,581 | 7/1992 | Ishibashi | 365/154 X |
| 5,157,474 | 10/1992 | Ochii | 365/154 X |
| 5,267,192 | 11/1993 | Nogami | 365/154 |

FOREIGN PATENT DOCUMENTS

| | | | |
|---|---|---|---|
| 0436323 | 7/1991 | European Pat. Off. | 365/154 |
| 0211751 | 9/1988 | Japan | 365/154 |
| 0134869 | 5/1990 | Japan | 365/154 |

Primary Examiner—Eugene R. LaRoche
Assistant Examiner—Son Mai
Attorney, Agent, or Firm—Hill, Steadman & Simpson

[57] ABSTRACT

A semiconductor memory apparatus comprises a flip-flop circuit formed of a pair of inverters formed of driver transistors formed on a semiconductor substrate and having an input and an output coupled to each other in a crossing fashion, and transistors formed on a semiconductor thin film formed on the semiconductor substrate, and a pair of access transistors coupled to drain electrodes of the inverters constructing the flip-flop circuit. In this semiconductor memory apparatus, a coupling capacitance is formed on an overlapping portion in which active layers of the semiconductor thin film transistors and gate electrodes of the semiconductor thin film transistors are overlapped to each other and a part of the overlapping portion in which the coupling capacitance is formed is formed within a contact hole, thereby forming a coupling capacitance between the gate electrode and the drain electrode of the inverters. A soft error, caused by an α-particle or the like, can be prevented by this coupling capacitance. Furthermore, at least an impurity concentration of the drain region of the semiconductor thin film transistor at its portion in which the coupling capacitance is formed is selected to be lower than that of the source region of the semiconductor thin film transistor. Thus, a standby current can be suppressed by suppressing an off-state current of the semiconductor thin film transistor.

2 Claims, 10 Drawing Sheets

STATIC RANDOM ACCESS MEMORY CELL STRUCTURE HAVING A THIN FILM TRANSISTOR LOAD

BACKGROUND OF THE INVENTION

1. Field of the Invention

The present invention generally relates to a static random access memory (SRAM) having a thin film transistor load and, more particularly, to a static random access memory cell structure having a thin film transistor load in which a data hold capability can be enhanced and an immunity for soft error caused by α-particle or the like can be improved.

2. Description of the Prior Art

Recently, a CMOS (complementary metal oxide semiconductor) type SRAM (static random access memory) that utilizes a CMOS inverter receives a remarkable attention as a SRAM capable of reducing its electric power consumption. The CMOS circuit, however, needs a region in which an N-MOS transistor and a P-MOS transistor are separated. There is then the problem that the CMOS circuit is disadvantageous when an integration level is increased.

It has been proposed so far to increase an integration level by forming a load P-MOS transistor of a reverse-stagger type TFT (thin film transistor). That is, by laminating a P-channel TFT (hereinafter simply referred to as a P-TFT) on the N-MOS transistor, an occupied area of the C-MOS circuit can be reduced considerably, which can realize the highly-integrated CMOS type SRAM with ease.

A structure of a conventional CMOS-type SRAM will be described with reference to FIG. 1 forming an equivalent circuit diagram and FIG. 2 forming a cross-sectional view thereof.

As shown in FIG. 1, the conventional SRAM includes a memory cell which comprises a flip-flop circuit FF formed of loads of a pair of driver transistors (N-MOS transistors) $Tr_1$, $Tr_2$ and a pair of P-channel thin film transistors (hereinafter simply referred to as P-TFTs) $T_1$, $T_2$ coupled to memory nodes $N_1$, $N_2$ of the driver transistors $Tr_1$, $Tr_2$ and a pair of access transistors (N-MOS transistors) $Q_1$, $Q_2$. In FIG. 1, reference symbol WL denotes a word line and reference symbols BL and (invertled BL) denote, bit lines.

A structure of SRAM will be described with reference to FIG. 2. As shown in FIG. 2, a gate electrode $GD_1$ of the driver transistor $Tr_1$ and a gate electrode (word line) of the access transistor $Q_2$ are formed on a P-type well region 31 over a gate insulating film 32 made of $SiO_2$ or the like by a first semiconductor layer, for example, a polycide layer. Gate electrodes $GT_1$, $GT_2$ of P-TFT ($T_1$ and $T_2$) are formed on the gate electrode $GD_1$ with an interlevel insulator 33 made of $SiO_2$ by a second semiconductor layer, for example, a polycrystalline silicon layer. An active layer $Ac_1$ of P-TFT ($T_1$) and a Vcc line 35 are formed on the gate electrodes $GT_1$ and $GT_2$ with an interlevel insulator 34 made of $SiO_2$.

The memory node $N_1$ is formed at the connected portion of the gate electrode $GD_1$ of the driver transistor $Tr_1$ and one source-drain region SD of the access transistor $Q_2$. In FIG. 2, reference numerals 36, 37 designate interlevel insulators made of $SiO_2$, reference numeral 38 designates a bit line deriving wiring made of a metal film (e.g., Al film). Reference numeral 39 designates a P-type silicon substrate and 40 an N-type well region.

According to the prior art, in order to prevent soft error from being caused by α-particle or the like, the gate electrode $GT_1$ of the P-TFT ($T_1$) is extended up to the lower portion of a drain region 41D that is connected to the memory node $N_1$ of the active layer $Ac_1$, thereby forming a coupling capacitance between the gate electrode $GT_1$ and the drain region 41D. A coupling capacitance is formed also between the gate electrode $GT_1$ of the P-TFT ($T_1$) and the gate electrode $GD_1$ of the driver transistor $Tr_1$.

An equivalent circuit of the above-mentioned structure shown in FIG. 2 is represented in FIG. 1, wherein the memory nodes $N_1$ and $N_2$ are coupled by a coupling capacitance C. The aforesaid soft error can be suppressed by the coupling capacitance C (see IEDM 88, pp. 48 to 51 "A 25 $\mu m^2$, New Poly-Si PMOS Load (PPL) SRAM Cell Having Excellent Soft Error Immunity").

As is clear from FIG. 2, the coupling capacitance C in the SRAM is formed on the upper portion of the driver transistor $Tr_1$ and a capacitance value thereof is determined by an area that is substantially determined by the layout of the SRAM.

If a soft error immunity is improved by increasing the capacitance value, then a memory cell size of the SRAM must be increased or the insulating film 34 serving as a dielectric film of the coupling capacitance formed between the gate electrode $GT_1$ and the drain region 41D must be reduced in thickness.

The increase of memory cell size contradicts the increase of capacitance. Also, if the insulating film 34 serving as the dielectric film of the coupling capacitance C is reduced in thickness, then a withstand voltage, yield, TDDB life or the like will be degraded. Therefore, the increase of capacitance value cannot be realized with ease.

Furthermore, in the SRAM, the source region 41S of the P-TFT ($T_1$, $T_2$) becomes a Vcc power supply line directly. Consequently, in order to lower its wiring resistance, the source region 41S and the drain region 41D of the P-TFT ($T_1$, $T_2$) are formed with high impurity concentration higher than $10^{19}$ cm$^{-3}$ at the same time.

When the coupling capacitance is formed at the overlapping portion of the drain region 41D having high impurity concentration and the gate electrodes $GT_1$, $GT_2$, if a gate electric field is applied to the drain region 41D, then a drain leakage current due to a tunneling current in energy band occurs at the drain region end adjoining to the channel region 41C. Consequently, an off-state current of the P-TFT ($T_1$, $T_2$) is raised.

OBJECTS AND SUMMARY OF THE INVENTION

In view of the aforesaid aspect, it is an object of the present invention to provide a semiconductor memory apparatus in which a large coupling capacitance can be obtained without increasing a memory cell size.

It is another object of the present invention to provide a semiconductor memory apparatus in which a coupling capacitance can be formed without increasing a drain leakage current in a semiconductor thin film transistor, i.e., an off-state current.

According to a first aspect of the present invention, there is provided a semiconductor memory apparatus having a memory cell which comprises a flip-flop circuit serving as a load formed of a pair of driver transistors and a pair of semiconductor thin film transistors laminated on the driver transistors via memory nodes serving as junctions and a pair of access transistors and in which a coupling capacitance is formed between the memory nodes. The coupling capacitance is formed at a portion in which an active layer of the semiconductor thin film transistor and a gate electrode of the semiconductor thin film transistor are overlapped with each other. A part of the overlapping portion in which the coupling capacitance is formed is extended into a contact hole.

According to the aforesaid structure, the coupling capacitance is formed at the portion in which the active layer of the semiconductor thin film transistor and the gate electrode of the semiconductor thin film transistor are overlapped with each other and a part of the overlapping portion is extended into the contact hole, whereby a side wall portion in the inside of the contact hole serves as one portion of an area in which the coupling capacitance is formed. As a consequence, the substantial area in which the coupling capacitance is formed is increased without increasing the memory cell size and the capacitance value of the coupling capacitance is increased, thereby improving a soft error immunity.

According to a second aspect of the present invention, there is provided a semiconductor memory apparatus having a memory cell which comprises a flip-flop circuit serving as a load formed of a pair of driver transistors and a pair of semiconductor thin film transistors laminated on the driver transistors via memory nodes serving as junctions and a pair of access transistors.

Gate electrodes of the semiconductor thin film transistors are extended up to the lower portion of a drain region coupled to the memory nodes of active layers to thereby form coupling capacitances between the drain region and the gate electrodes. Also, the memory nodes are coupled by the coupling capacitances. An impurity concentration of a portion (i.e., portion overlapping the gate electrode of the drain region) in which a coupling capacitance in the drain region of the semiconductor thin film transistors is formed is selected to be lower than that of at least the source region of the semiconductor thin film transistor.

According to a third aspect of the present invention, there is provided a semiconductor memory apparatus having a memory cell which comprises a flip-flop circuit serving as a load formed of a pair of driver transistors and a pair of semiconductor thin film transistors laminated on the driver transistors via memory nodes serving as junctions and a pair of access transistors.

Gate electrodes of the semiconductor thin film transistors are extended up to the lower portion of a drain region coupled to the memory nodes of active layers to thereby form coupling capacitances between the drain region and the gate electrodes. Also, the memory nodes are coupled by the coupling capacitances. An impurity concentration of a portion (i.e.; whole drain region including a portion overlapping the gate electrode and other portion) including portions in which the coupling capacitances are formed is selected to be lower than that of at least the source region of the semiconductor thin film transistors.

According to the aforesaid structure, the impurity concentration of the portion in which the coupling capacitances in the drain region are formed is selected to be lower than that of the source region, whereby desired coupling capacitances are formed between the gate electrodes and the drain region. Also, a drain leakage current caused by a tunneling current in energy band at the drain region end adjoining the channel region can be suppressed and therefore the stand-by current can be prevented from being increased.

Furthermore, according to the present invention, even when the impurity concentrations of the whole drain region including the portion in which the coupling capacitances are formed and other portions are selected to be lower than that of the source region, the desired coupling capacitances are formed between the gate electrodes and the drain region similarly as described above. Also, the drain leakage current caused by the tunneling current in energy band at the drain region end can be suppressed and therefore the off-state current can be prevented from being increased.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

A first embodiment of the present invention will now be described with reference to FIGS. 3 to 5.

Figure 1:
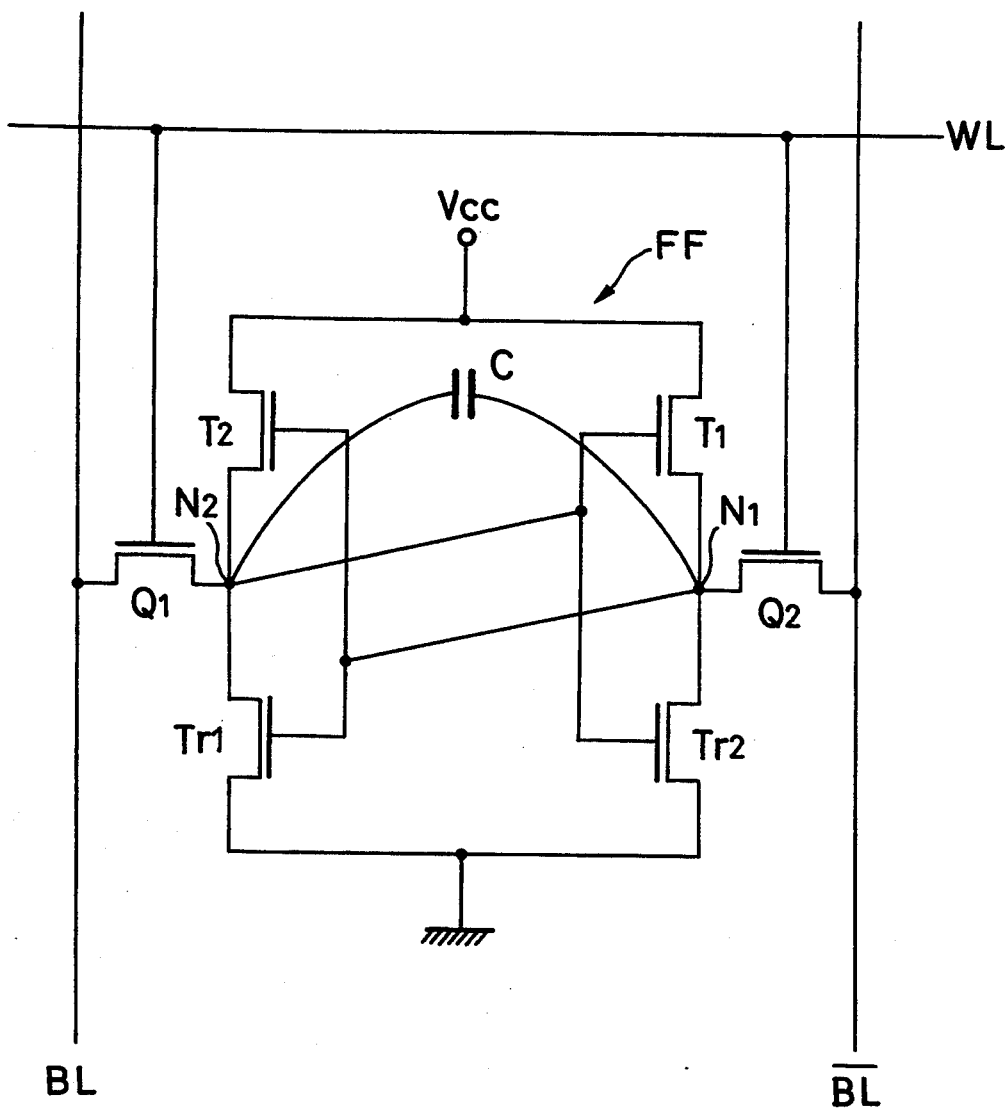
FIG. 1 is a diagram showing an equivalent circuit of a conventional SRAM.
Figure 2:
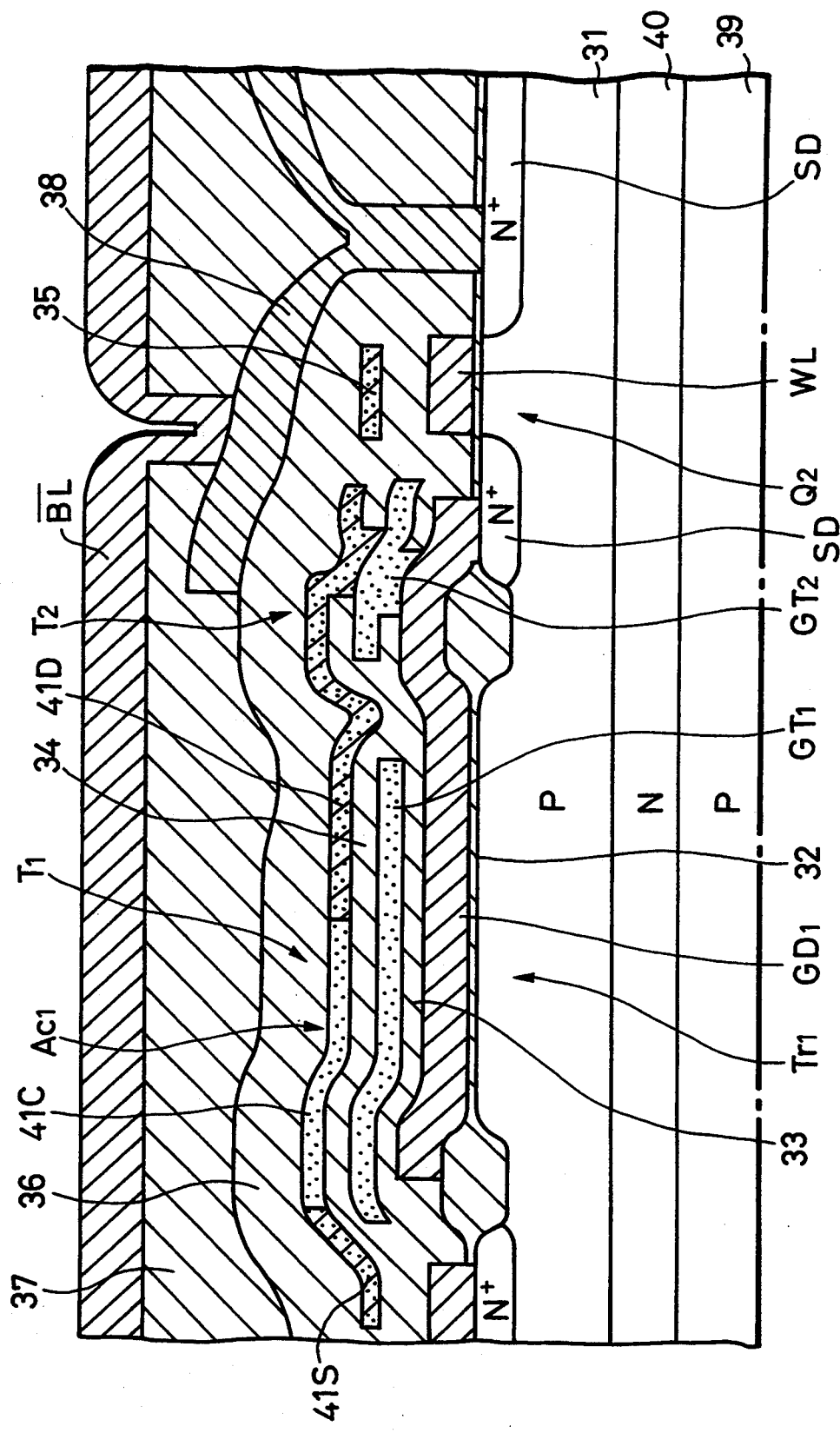
FIG. 2 is a cross-sectional view illustrative of the conventional SRAM.
Figure 3:
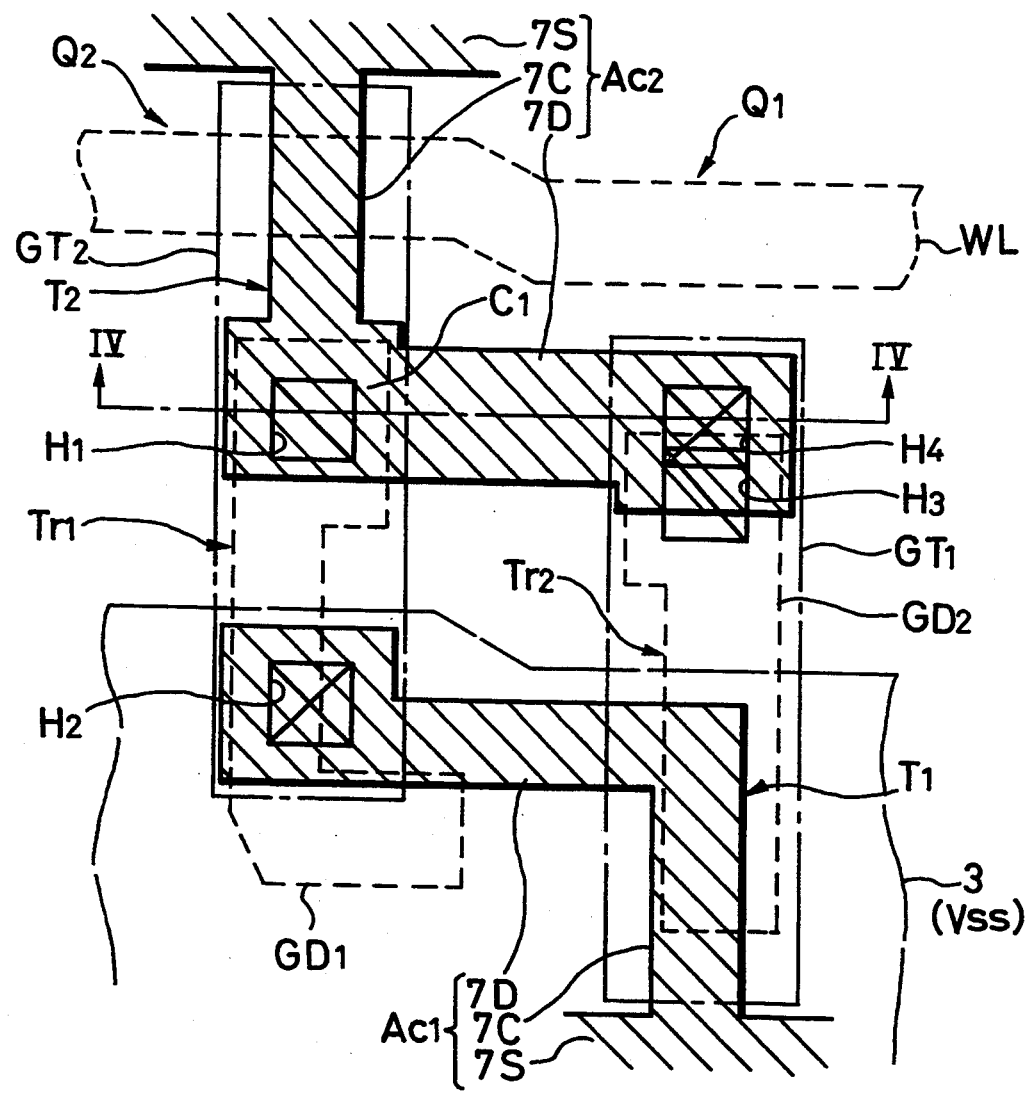
FIG. 3 is a plan view illustrative of an SRAM according a first embodiment of the present invention.
Figure 4:
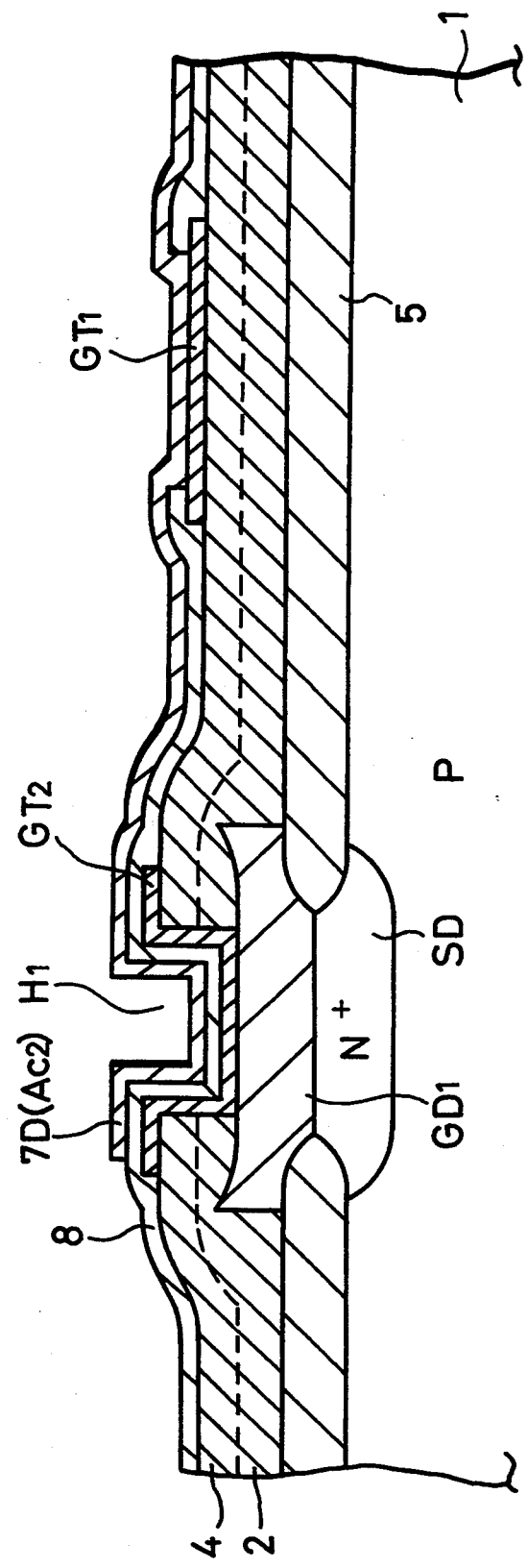
FIG. 4 is a cross-sectional view taken through the line IV—IV in FIG. 3.

FIG. 3 is a plan view showing a structure of an SRAM according to the first embodiment of the present invention. In order to understand the present invention more clearly, the bit line (Al wiring) BL, the driver transistors $Tr_1$, $Tr_2$ and the source-drain regions (diffusion layers) of the access transistors $Q_1$, $Q_2$ are not shown in FIG. 3. FIG. 4 is a cross-sectional view of a main portion thereof, and FIG. 5 is a diagram showing an equivalent circuit of the SRAM according to the first embodiment of the present invention.

Figure 5:
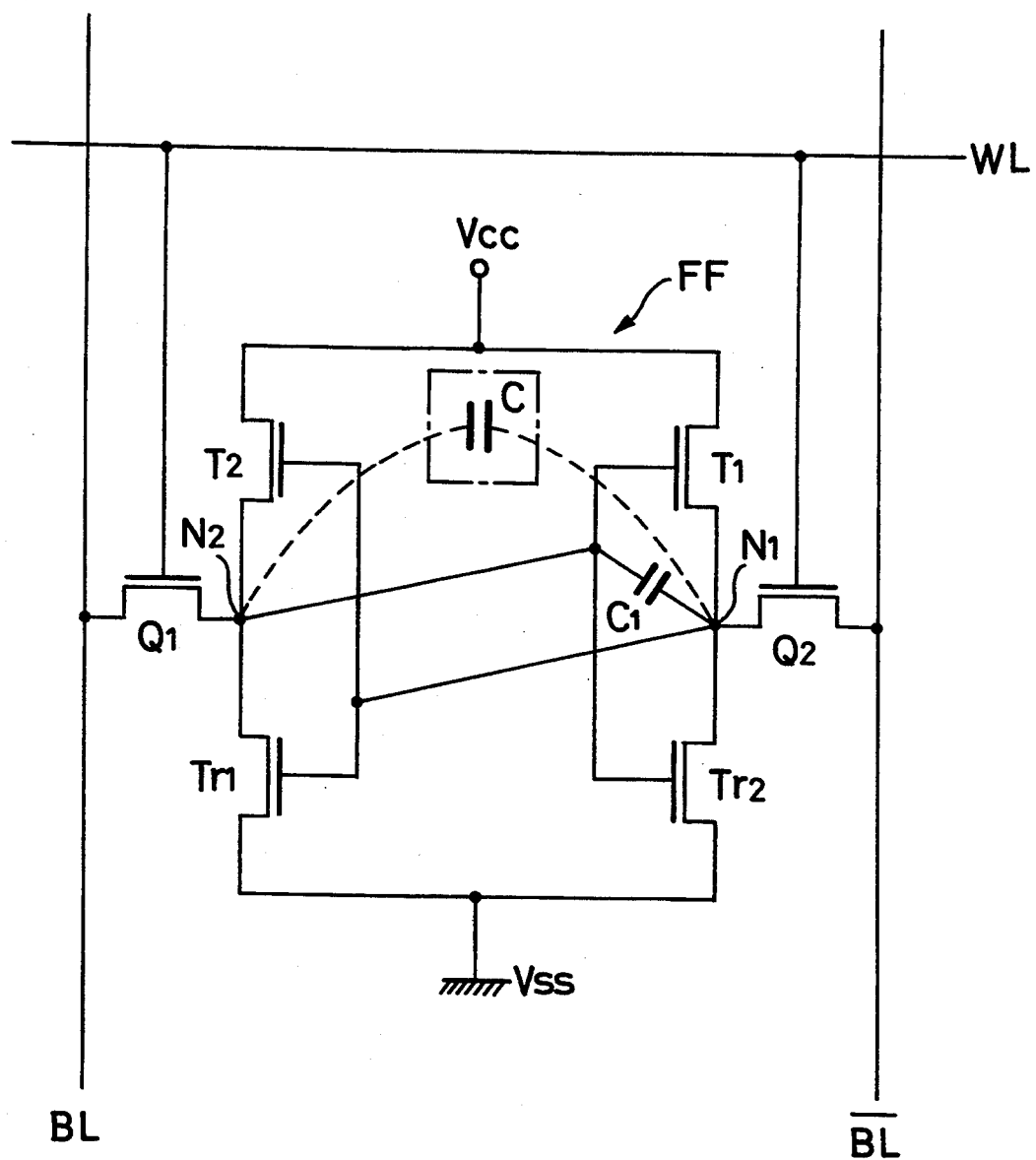
FIG. 5 is a diagram showing an equivalent circuit of the SRAM according to the first embodiment of the present invention.

As shown in FIG. 5, the SRAM according to the first embodiment includes a memory cell which comprises a flip-flop circuit FF formed of loads of a pair of driver transistors (N-MOS transistors) $Tr_1$, $Tr_2$, and a pair of P-channel thin film transistors (hereinafter simply referred to as P-TFTs) $T_1$, $T_2$ coupled to the memory nodes $N_l$, $N_2$ of the driver transistors $Tr_1$, $Tr_2$ and a pair of access transistors (N-MOS transistors) $Q_1$, $Q_2$. In FIG. 5, reference symbol WL denotes a word line and reference symbols BL and (inverted BL) denote bit lines, respectively.

A structure of this SRAM will be described with reference to FIGS. 3 and 4. As illustrated, gate electrodes $GD_1$, $GD_2$ of the driver transistors $Tr_1$, $Tr_2$ and gate electrodes of access transistors $Q_1$, $Q_2$. i.e., word line WL are formed on a P-type well region 1 through a gate insulating film made of $SiO_2$ or the like by a first semiconductor layer, for example, a polycide layer on which a Vss line (ground line) 3 is formed through an interlevel insulator 2 made of $SiO_2$ or the like by a second semiconductor layer, for example, a polycrystalline silicon layer.

Gate electrodes $GT_1$, $GT_2$ of the P-TFTs ($T_1$ and $T_2$) are formed on the Vss line 3, the gate electrodes $GD_1$, $GD_2$ and the word line WL though an interlevel insulator 4 made of $SiO_2$ by a third semiconductor layer, for example, a polycrystalline silicon layer. Active layers $Ac_1$, $Ac_2$ of the P-TFTs ($T_1$ and $T_2$) and a Vcc line (not shown) are formed on the gate electrodes $GT_1$ and $GT_2$ by a fourth semiconductor layer, for example, a polycrystalline silicon layer. In FIGS. 3 and 4, reference numerals 7C, 7S and 7D respectively denote a channel region, a source region and a drain region in the active layers $Ac_1$, $Ac_2$. A voltage Vcc is applied to the source region 7S.

Memory nodes $N_1$, $N_2$ shown in FIG. 5 are constructed at the connected portion of the driver transistors $Tr_1$, $Tr_2$ and the P-TFTs ($T_1$ and $T_2$).

In this embodiment, the gate electrode $GD_1$ coupled to the source-drain region SD of the access transistor $Q_2$ of the driver transistor $Tr_1$ and the gate electrode $GT_2$ of the P-TFT ($T_2$) are coupled together via a first contact hole $H_1$. The gate electrode $GT_2$ of the P-TFT ($T_2$) and the active layer of the P-TFT ($T_1$), i.e., the drain region 7D thereof are coupled together via a second contact hole $H_2$ that is distant from the first contact hole $H_1$. The contact holes $H_1$, $H_2$ correspond to the memory nodes $N_1$, $N_2$.

The gate electrode $GT_1$ of the P-TFT ($T_1$) and the gate electrode $GD_2$ of the driver transistor $Tr_2$ are coupled together via a third contract hole $H_3$. The gate electrode $GT_1$ of the P-TFT ($T_1$) and the active layer $Ac_2$ of the P-TFT ($T_2$), i.e., drain region 7D thereof are coupled together via a fourth contact hole $H_4$ that partly overlaps the third contact hole $H_3$. The contact holes $H_3$ and $H_4$ correspond to the memory node $N_2$.

The contact hole $H_1$ is formed at the center of the overlapping portion of the gate electrode $GT_2$ of the P-TFT ($T_2$) and the drain region 7D through a gate insulating film 8. The drain region 7D is extended into the contact hole $H_1$ via the gate insulating film 8 so as to overlap the gate electrode $GT_2$ of the P-TFT ($T_2$) serving as a lower layer. Thus, a coupling capacitance $C_1$ (shown cross-hatched in FIG. 3) is formed between the gate electrode $GT_2$ and the drain region 7D including the inside of the contact hole $H_1$. That is, when this structure is considered from an equivalent circuit standpoint, as shown in FIG. 5, it is to be noted that the memory nodes $N_1$ and $N_2$ are coupled by the coupling capacitance C. A soft error can be suppressed by the coupling capacitance C (i.e., coupling capacitance $C_1$).

According to the aforesaid embodiment, since the drain region 7D of the P-TFT ($T_2$) is extended into the first contact hole $H_1$ which couples the gate electrode $GT_2$ of the P-TFT ($T_2$) and the gate electrode $GD_1$ of the driver transistor $Tr_1$, the side wall portion of the contact hole $H_1$ serves also as the coupling capacitance, $C_1$, thereby increasing the area of the coupling capacitance $C_1$ on the whole.

Therefore, even when the area of the memory cell is reduced to reduce the area of the portion in which the coupling capacitance $C_1$ is formed from a plan view standpoint, a capacitance value that is enough for soft error immunity can be obtained because the side wall portion of the contact hole $H_1$ is effectively utilized. Thus, the improvement of the high integration level of the SRAM itself can be promoted.

A second embodiment of the present invention will be described with reference to FIGS. 6 through 9.

Figure 6:
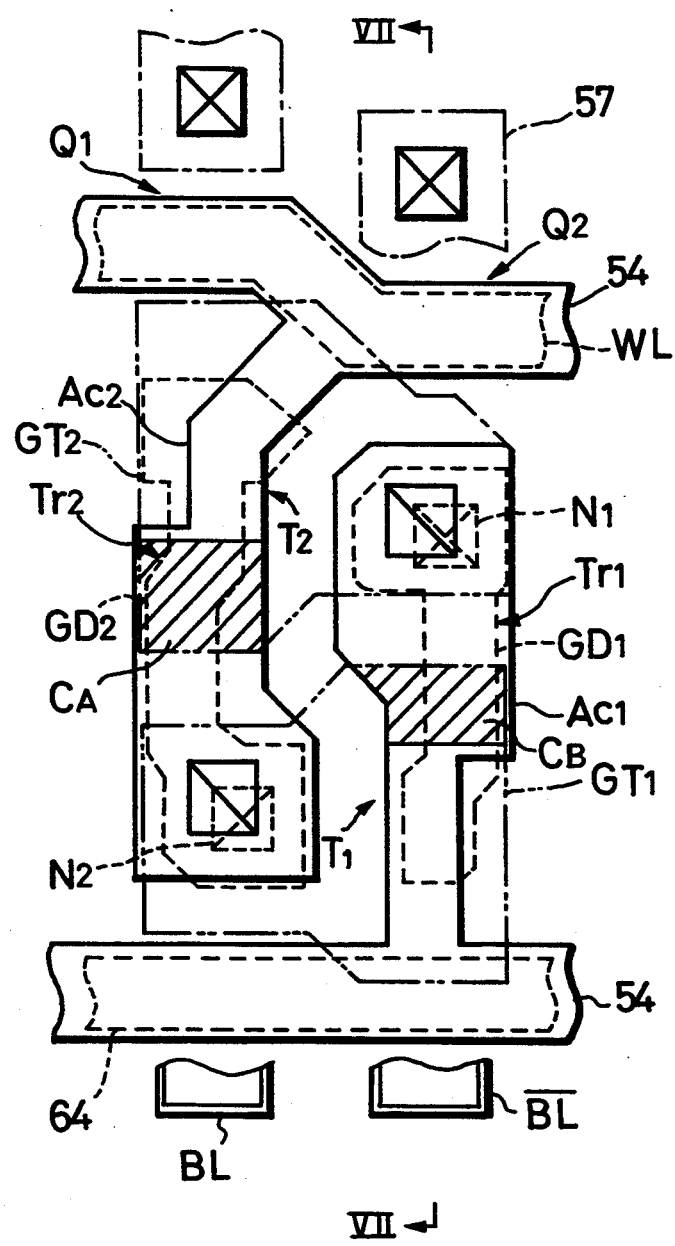
FIG. 6 is a plan view illustrative of the SRAM according to a second embodiment of the present invention.
Figure 7:
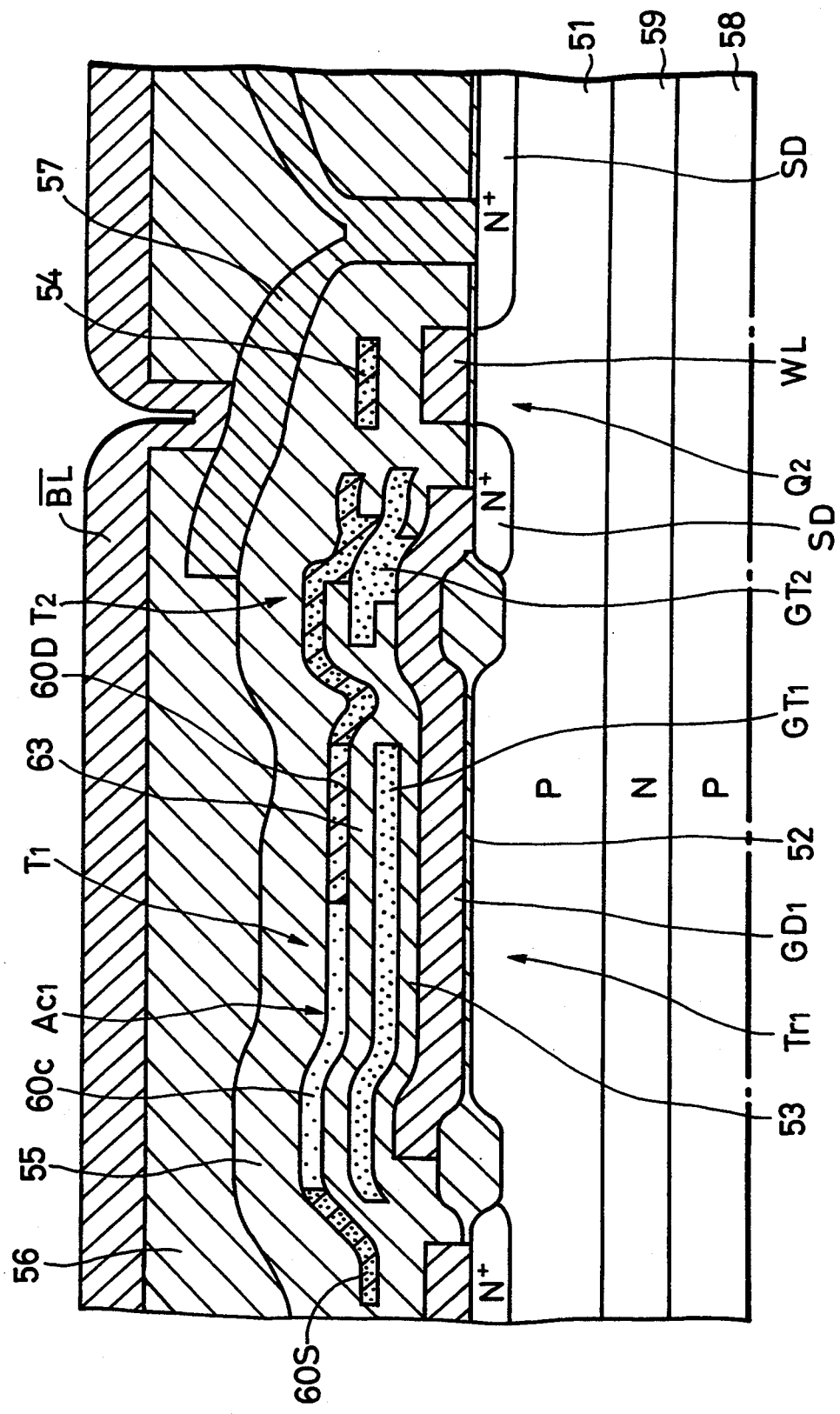
FIG. 7 is a cross-sectional view taken through the line VII—VII in FIG. 6.
Figure 8:
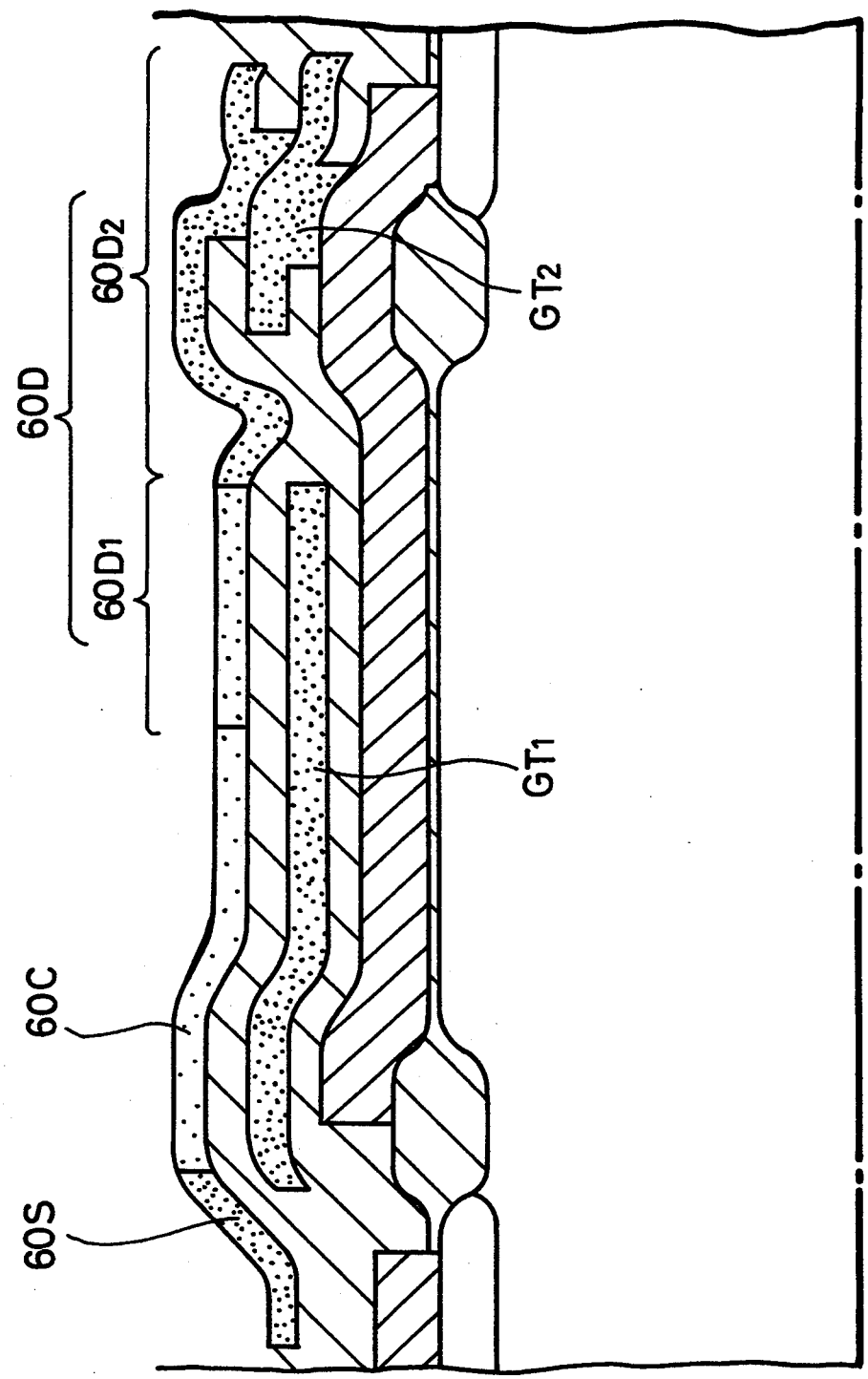
FIG. 8 is a cross-sectional view illustrating a main portion of FIG. 7 in an enlarged scale.
Figure 9:
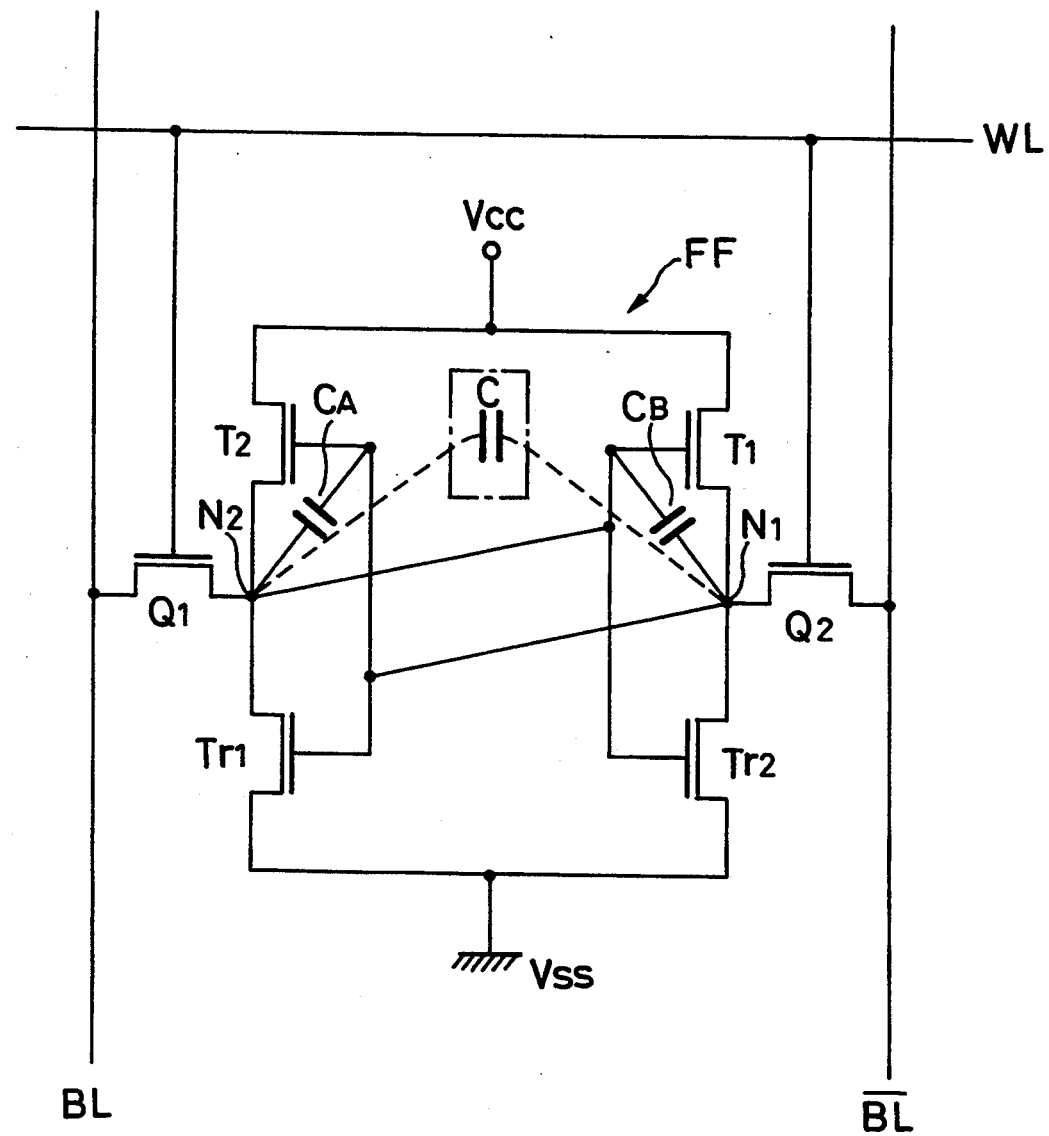
FIG. 9 is a diagram showing an equivalent circuit of the SRAM according to the second embodiment of the present invention.

FIG. 6 is a plan view illustrative of a structure of the SRAM according to the second embodiment of the present invention. FIG. 7 is a cross-sectional view taken along the line VII—VII in FIG. 6. FIG. 8 is a cross-sectional view illustrating a main portion of FIG. 7 in an enlarged scale, and FIG. 9 is a diagram showing an equivalent circuit of the SRAM according to the second embodiment of the present invention. In FIGS. 6 to 9, like parts corresponding to those of FIGS. 3 to 5 are marked with the same references and therefore need not be described in detail.

As shown in FIG. 9, the SRAM according to the second embodiment includes a memory cell which comprises the flip-flop circuit FF formed of loads formed of the pair of driver transistors (N-MOS transistors) $Tr_1$, $Tr_2$ and the pair of P-channel transistors (hereinafter simply referred to as P-TFTs) $T_1$, $T_2$ coupled to the memory nodes $N_1$, $N_2$ of the driver transistors $Tr_1$, $Tr_2$ and the pair of access transistors (N-MOS transistors) $Q_1$, $Q_2$. In FIG. 9, reference symbol WL denotes a word line and reference symbols BL and (inverted BL) denote bit lines, respectively.

The structure of this SRAM will be described with reference to FIGS. 6 and 7. As shown in FIGS. 6 and 7, the gate electrodes $GD_1$, $GD_2$ of the driver transistors $Tr_1$, $Tr_2$ (see FIG. 6 with respect to the driver transistor $Tr_2$) and the gate electrodes of the access transistors $Q_1$ and $Q_2$ (see FIG. 6 with respect to the access transistor $Q_1$). i.e., word line WL are formed on a P-type well region 51 through a gate insulating film 52 made of $SiO_2$ or the like by a first semiconductor layer, e.g., polycide layer. The gate electrodes $GT_1$, $GT_2$ of the P-TFTs ($T_1$ and $T_2$) are formed on the gate electrodes ($GD_1$, $GD_2$) and the word line BL through an interlevel insulator 53 made of $SiO_2$ by a second semiconductor layer, e.g., polycrystalline silicon layer. The active layers $Ac_1$, $Ac_2$ (see FIG. 6 with respect to the active layer $Ac_2$) of the P-TFTs ($T_1$ and $T_2$) and a Vcc line 54 are formed on the gate electrodes $GT_1$ and $GT_2$ by a third semiconductor layer, e.g., polycrystalline silicon layer.

The memory nodes $N_1$, $N_2$ shown in FIG. 9 are formed at the connected portions of the gate electrodes $GD_1$ and $GD_2$ of the driver transistors $Tr_1$ and $Tr_2$ and the source-drain region SD of the access transistors $Q_2$, $Q_1$.

In FIG. 7, reference numerals 55, 56 denote interlevel insulators made of $SiO_2$, respectively, 57 a bit line deriving wiring made of a metal film such as Al film or the like, 58 a P-type silicon substrate, and 59 an N-type well region. Further, reference numeral 60S denotes a source region to which the voltage Vcc is applied, 60D a drain region that is coupled to the memory nodes $N_1$, $N_2$, 60C a channel region, 63 a gate insulating film and 64 a ground line (Vss line), respectively.

In order to prevent a soft error from being caused by the α-particle or the like, the respective gate electrodes $GT_1$, $GT_2$ of the P-TFTs ($T_1$ and $T_2$) are extended up to the lower portion of the drain region 60D coupled to the memory nodes $N_1$, $N_2$ of the corresponding active layers $Ac_1$ and $Ac_2$. Also, coupling capacitances $C_A$ and $C_B$ are respectively formed between the overlapping portions of the gate electrodes $GT_1$, $GT_2$ and the drain region 60D. Coupling capacitances are also formed between the gate electrodes $GT_1$, $GT_2$ of the P-TFTs ($T_1$, $T_2$) and the gate electrodes $GD_1$ and $GD_2$ of the driver transistors $Tr_1$ and $Tr_2$.

FIG. 9 shows an equivalent circuit of the above-mentioned structure of the SRAM. As shown in FIG. 9, the memory nodes $N_1$ and $N_2$ are coupled by the coupling capacitances C and a soft error can be controlled by the coupling capacitances C ($C_A$, $C_B$).

In this embodiment, an impurity concentration of a portion 60D1 which overlaps the gate regions $GT_1$, $GT_2$ coupled to the coupling capacitances $C_A$, $C_B$ of the drain region 60D is selected to be lower than those of a portion 60D2 (side coupled to the memory nodes $N_1$, $N_2$) which does not overlap the gate electrodes $GT_1$, $GT_2$ of the drain region 60D and the source region 60S.

More specifically, since the source region 60C of the P-TFTs ($T_1$, $T_2$) directly serves as the Vcc line 54, the wiring resistance must be powered. For this reason, the source region 60C and the portion 60D2 that is coupled to the memory nodes $N_1$, $N_2$ of the drain region 60D simultaneously formed are doped with impurities of concentration higher than the order of $10_{19}$ cm$^{-3}$. By way of example, this is achieved when the active layers $Ac_1$, $Ac_2$ of a polycrystalline silicon layer having a thickness of 400 Å are ion-implanted by $BF_2^+$ with a dose amount of about $1\times10_{15}$ cm$^{-2}$.

An impurity concentration of the overlapping portion 60D1 which overlaps the gate electrodes $GT_1$, $GT_2$ in which the coupling capacitances $C_A$, $C_B$ of the drain region 60D are formed is selected to be lower than the order of $10^{18}$ cm$^{-3}$ order. By way of example, this is achieved when the active layers $Ac_1$, $Ac_2$ of the polycrystalline silicon layer having a thickness of 400 Å are ion-implanted by $BF_2^+$ with a dose amount of $10^{13}$ cm$^{-2}$.

According to the structure of the second embodiment, the respective gate electrodes $GT_1$, $GT_2$ of the P-TFTs ($T_1$ and $T_2$) are extended up to the lower portion of the drain region 60D of the corresponding active layers $Ac_1$, $Ac_2$, whereby the soft error preventing coupling capacitances $C_A$, $C_B$ are formed between the gate electrodes $GT_1$, $GT_2$ and the overlapping portion 60D1 of the drain region 60D.

In particular, since the impurity concentration of the drain region 60D at its overlapping portion 60D1 that overlaps the gate electrodes $GT_1$, $GT_2$ is selected to be lower than those of other portion 60D2 of the drain region and the source region 60S, a drain leakage current (leakage current caused by a so-called electric field dependency) due to a tunneling current in energy band can be suppressed at the drain region end adjoining the channel region 60C. Therefore, the coupling capacitance having enough capacitance value can be formed without increasing the off-state current of the P-TFTs ($T_1$ and $T_2$).

Figure 10:
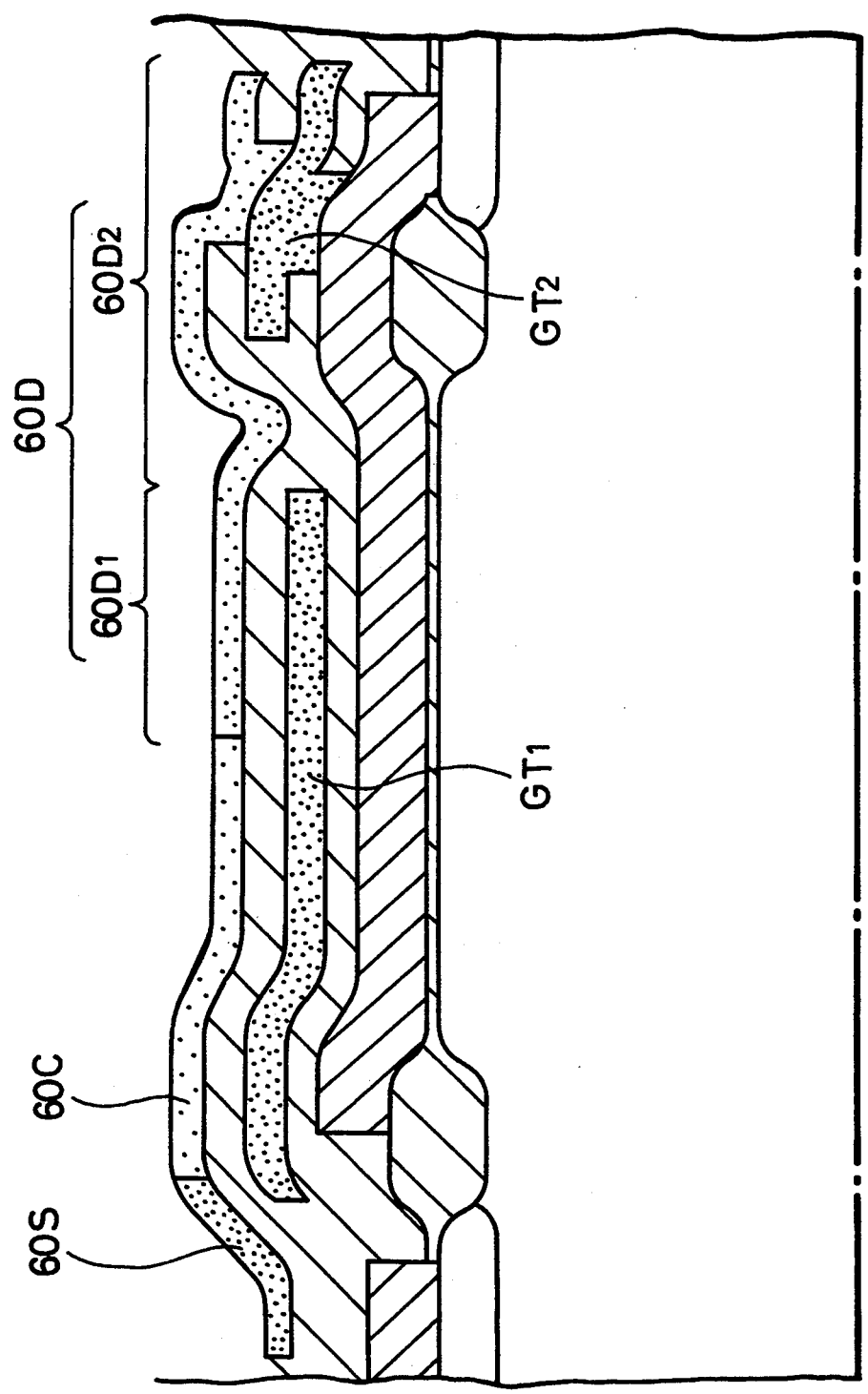
FIG. 10 is a cross-sectional view illustrating a main portion of a modified example of the present invention in an enlarged scale.

FIG. 10 shows a modified example of the present invention.

While the impurity concentration of the drain region 60D at its overlapping portion 60D1 which overlaps the gate electrodes $GT_1$, $GT_2$ is selected to be low as described in the second embodiment shown in FIG. 8, the present invention is not limited thereto and the following variant is also possible. As shown in the modified example of FIG. 10, the impurity concentration of the whole drain region 60D including the overlapping portion 60D1 overlapping the gate electrodes $GT_1$, $GT_2$ and the portion 60D2 that is coupled to the memory nodes $N_1$, $N_2$ may be selected to be lower than that of the source region 60S. Also, in accordance with this structure, a drain leakage current caused by the tunneling current in energy band can be suppressed at the drain region end. Therefore, a coupling capacitance can be formed between the gate electrodes $GT_1$, $GT_2$ and the drain region 60D without increasing the off-state current.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor memory apparatus comprising:
    a flip-flop circuit formed of a pair of driver transistors formed on a semiconductor substrate and having gate, drain and source electrodes, a pair of thin film transistors having drain, source and gate electrodes, and formed on a semiconductor thin film formed on said semiconductor substrate, the drain electrodes of each of said pair of driver transistors coupled to the gate electrodes of the other driver transistor in a crossing fashion;
    a pair of access transistors formed on said substrate and coupled to said flip-flop circuit and to said drain electrodes of said driver transistors, said semiconductor thin film transistors which are formed on a semiconductor thin film coupled to said driver transistors through a contact hole formed on drain portions of said driver transistors, coupling capacitance formed between overlapping gate electrodes of said semiconductor thin film transistors and said gate electrodes of said driver transistors within said contact hole, and wherein said contact hole is formed so as to couple said gate electrode of said thin film transistor and the gate electrode of said driver transistor and an insulation layer formed between them on side walls and the bottom of said contact hole so as to increase the capacitance between said gates.

2. A semiconductor memory apparatus comprising:
    a flip-flop circuit formed of a pair of driver transistors formed on a semiconductor substrate and having source, drain and gate electrodes coupled to each other, a pair of thin film transistors with source, drain and gate electrodes formed on a semiconductor thin film on said semiconductor substrate, the drain electrodes of each of said pair of driver transistors coupled to the gate electrodes of the other driver transistor in a crossing fashion;
    a pair of access transistors coupled to said flip-flop circuit and to said drain electrodes of said driver transistors, said thin film transistors formed of semiconductor thin films laminated on said driver transistors, said gate electrodes of said semiconductor thin film transistors coupled to the drain electrodes of said thin film transistors through an insulation film, and the impurity concentration of at least a portion of said drain regions of said thin film transistors being lower than said source region of said semiconductor thin film transistors, and wherein said drain regions of said thin film transistors have at least two portions with different impurity concentration and with one portion having an impurity concentration which is lower than the impurity concentration of said sources of said thin film transistors.

* * * * *